United States Patent Office 3,149,021

Patented Sept. 15, 1964

3,149,021

PANEL FOR PRINTED CIRCUITS

George J. Goepfert, Francis H. Bratton, and Fred U. Zolg, Cincinnati, Ohio, assignors to The Cincinnati Milling Machine Company, Cincinnati, Ohio, a corporation of Ohio No Drawing. Filed Aug. 10, 1959, Ser. No. 832,428
14 Claims. (Cl. 161—214)

This invention is addressed to the problem of improving the adherence of methyl methacrylate reisn compositions to other materials. The invention may be usefully employed in the art of printed circuit manufacture wherein panels comprising a copper sheet laminated to a resin base are printed and etched to produce a desired electrical circuit. In accordance with the present invention the resin base of such a panel may be formed of a modified polymethylmethacrylate composition which exhibits substantially improved adhesion to the copper layer of the laminate. For purposes of clarity and simplicity the invention is described herein, for the most part, in relation to its use in making such laminated panels. However, as the description proceeds, it will become apparent that the invention may be used for other applications wherein improved adherence of methyl methacrylate resin compositions is necessary or desirable.

Laminated panels for the manufacture of printed circuits are commonly made by coating a copper sheet with a modified phenolic resin adhesion layer and then laminating phenolic resin impregnated paper sheets to the adhesive layer to produce a phenolic resin paper base to which the copper sheet is adherent. While such laminated panels have been extensively used in the manufacture of printed circuits, it is generally recognized that they are subject to a number of disadvantages. One group of these disadvantages arises out of the fact that in the course of manufacture of printed circuits the laminate is brought into contact with a molten soldering bath at a moderately high temperature, and the consequent heating of the laminated panel causes difficulties. For example, this heating of the panel may induce vaporization of residual solvent in the adhesive layer and cause the copper cladding to blister. Heating of the panel may tend to cause degradation of the polymer and loss in mechanical strength. Also the temperature coefficient of expansion of the phenolic resin is higher than that of copper and this tends to produce warping of the panel when the lamniate is heated. Another disadvantage of the prior art laminates is that the adhesion of the copper to the base laminate varies considerably. Not only is a high order of adhesion of the copper to the laminate of great importance but also a high degree of uniformity is a prerequisite particularly in circuits in which the printed wiring is $\frac{1}{10}''$ and thinner in width.

It is known that polymethylmethacrylate has a number of properties which would make its use desirable as the resin base of a printed circuit laminate. Thus it has good electrical properties, polymerizes without loss of volatile materials and can be compounded to have a temperature coefficient of expansion close to that of copper. Also since polymethylmethacrylate is a thermoplastic resin, laminates made therewith can be readily post-formed to desired shapes. On the other hand, it is known that methylmethacrylate does not polymerize well in the presence of copper. Furthermore if an effort is made to laminate a copper foil to a polymethylmethacrylate base, substantially no adherence of the copper to the polymethylmethacrylate is obtained.

In accordance with the present invention the adhesivity of methylmethacrylate resin compositions is improved by incorporating an adhesion promoter in the composition.

It is an object of the present invention to provide a methylmethacrylate resin composition having an adhesion promoter therein which improves the adhesion of the resin composition to other materials such as copper. It is another object of the invention to provide a copper-clad plastic panel adapted to be used in printed circuit manufacture and comprising a copper foil and polymethylmethacrylate base strongly and uniformly bonded to one another over the entire area of the adjoining surfaces. As pointed out above, this is of great importance where the product is to be used for printed circuit board since the "wiring" on the board may consist of copper strips $\frac{1}{10}''$ or less in width. It is still another object of the invention to provide a panel of this type having electrical and mechanical properties superior to those of the known phenolic base panels. It is still a further object of the invention to provide a simple and effective method for laminating copper to a polymethylmethacrylate base to form a laminate wherein the copper foil is strongly adherent to the resin base. Other objects of the invention will be in part obvious and in part pointed out hereafter.

The present invention is predicated on our discovery that by incorporating certain types of polymers in a methylmethacrylate resin composition, the adhesion of the methylmethacrylate resin to copper is greatly improved. In general, these polymers are condensation products of polyhydric alcohols and polybasic acids, which will be referred to in the present application as polyesters. These products are to be distinguished from the copolymers of linear esters and styrene that are sometimes called polyester resins.

The polyesters that exhibit this adhesion-improving property may be prepared from polbasic acids having an olefinic bond in a position alpha to at least one of the carboxyl groups thereof. The nature of the esterifying alcohol does not appear to exert any considerable influence on adhesion promotion and any of the various polyhydric alcohols previously used in preparing polyesters can be employed, such as, for example, ethylene glycol; glycerol; propane-1,2-diol; propane-1,3-diol; diethylene glycol; pentane-1,5-diol; neopentyl glycol; 2-2,dihydroxy methyl dihydropyran; 2-butyne-1,4-diol; and 1,2,6 hexanetriol. Acids having a properly located olefinic bond include maleic acid, fumaric acid and itaconic acid and their anhydrides. Tribasic acids such as aconitic acid and isobutylene-alpha-gamma-gamma' tricarboxylic acid having properly located olefinic bonds may also be used. The polyesters may be made by condensation procedures known in the art, typical procedures being given in the examples set forth hereinafter. In general, while an excess of either ingredient can be used to prepare the polyesters of this invention, it is desirable that the polyhydric alcohol and polybasic acid be used in roughly equivalent proportions.

It has been found that mixtures of polyhydric alcohols and mixtures of acids may, if desired, be used in preparing the polyester adhesion promoter of the present invention. In the case of the acid component, the mixture of acids may contain saturated acids as well as the alpha olefinic acids mentioned above, provided that a substantial proportion of alpha olefinic acid is used. Thus the alpha olefinic acid should comprise at least about 25% by weight of the mixture of acids used in preparing the polyester. Saturated acids that may be used in preparing such mixed polyesters include oxalic, adipic, succinic and phthalic acids and their anhydrides. As indicated above, the alcohols may be saturated or unsaturated.

The optimum amount of polyester adhesion promoter to be used in the methylmethacrylate composition varies to some extent as a function of the nature of the polyester. Acceptable adhesion has been obtained with polyester adhesion promoters in methyl methacrylate resin compositions over the range 0.003 to 45 parts by weight of adhesion promoter per 100 parts of polymethylmethacrylate resin. However, the preferred proportions for most polyesters appear to be from 0.25 to 10 parts by weight per 100 parts of polymethylmethacrylate present.

Although as indicated above polyhydric alcohols having more than two alcohol groups and polybasic acids having more than two carboxyl groups can be used, polyesters formed by condensation of glycols and dicarboxylic acids are preferred. The structure of the linear polymers thus produced is more readily controllable and more accurately reproducible. Also when the alcohol and/or acid have more than two functional groups, a degree of cross-linking is obtained which may proceed so far as to render the product incompatible with the methyl methacrylate resin into which it is to be incorporated.

The methylmethacrylate resin composition used as a starting material is desirably a liquid mixture of the polymer and monomer, referred to herein as a partially polymerized liquid methylmethacrylate resin. This mixture may be made either by dissolving the polymer in the monomer or by partial polymerization of the monomer.

Copper-clad panels may be made from the modified methylmethacrylate resin compositions of the present invention in a variety of ways. A typical procedure for preparing such panels may comprise the following steps: a solution of polymethylmethacrylate in methyl methacrylate monomer is prepared and a polyester of the type referred to above is incorporated in this liquid resin. A piece of copper foil is carefully cleaned, and a suitable reticulate reinforcing structure such as a glass mat or cloth is laid on the cleaned surface of the copper foil. The modified methacrylate composition is then spread over the reinforcing structure in such manner that it penetrates and encases the reinforcing structure and comes into contact with the surface of the copper foil. The resulting composite structure is heated under pressure to complete the polymerization of the methyl methacrylate and to provide a panel comprising a reinforced polymethylmethacrylate base having the copper foil firmly adherent thereto. The resulting panel may desirably be subjected to a suitable post-cure treatment to insure complete polymerization of the monomeric material.

As indicated in the foregoing description of a typical embodiment of the present method, it is desirable in the manufacture of printed circuit panels that the plastic base be reinforced with a suitable reinforcing structure, preferably a fibrous material either in the form of loosely matted fibers, or in the form of woven cloth, or in the form of fibers dispersed throughout the plastic. The use of such fibrous reinforcement is known per se in the art, and in general any of the materials previously proposed for this purpose may be used in the present process. Thus the fibrous reinforcement may be composed of an inorganic material such as glass or asbestos, or an organic material such as cellulose, nylon, rayon and the like, or a mixture of different fibrous materials.

The adhesion promoter may be added to the methacrylate resin in any one of several different ways. It can be incorporated into the resin system and this composite system used to make a reinforced laminate. It can also be used as a coating on the copper or a binding agent on the reinforcing material. Polyesters of the type found suitable as adhesion promoters can be used as binders in the making of non-woven fibrous reinforcements wherein the polyester serves to bind together the fibers to provide mechanical strength to the non-woven reinforcement. In general, however, the preferred method is to add it directly to the methacrylate resin system.

It has been previously pointed out that the polyester promoter can be made from a mixture of acids comprising not only the adhesion-promoting alpha olefinic acid, but also saturated acids which do not enhance adhesion, provided that a substantial amount of the alpha-olefinic acid is present in the mixture. In like manner there are a number of other components that may be incorporated in the promoter and/or the methyl methacrylate resin without seriously diminishing the adhesion-promoting effect that is obtained. Thus it has been found that the methyl methacrylate resin may contain a proportion of other polymers or monomers such as cellulose acetate, butyrate, styrene methacrylate copolymers, methyl acrylate monomer or polymer, or acrylonitrile blended or copolymerized therewith. Such other resins appear to be inert from the standpoint of adhesion promotion when used in minor proportions in the resin mixture.

Printed circuit panels must meet numerous requirements other than those previously mentioned, and in order to meet these requirements various materials other than the promotor are desirably added to the methyl methacrylate composition. For example fillers such as calcium sulfate, aluminum silicates, clays, calcium carbonate, silica, calcium metasilicate, alumina, antimony oxide, and chlorinated biphenyl and terphenyl may be incorporated in the composition. Suitable fire retarding agents, such as chlorinated alkyl and aryl hydrocarbons may also be included. A catalyst is normally incorporated in the methyl methacrylate composition to promote polymerization thereof during the molding step of the present method. Any of the known methyl methacrylate polymerization catalysts may be used such as, for example, benzoyl peroxide, lauroyl peroxide, tertiary butyl perbenzoate and azodiisobutyronitrile.

In order to point out more fully the nature of the present invention the following specific examples are given of illustrative methods of carrying out the invention.

*Example 1*

A polyester adhesion promotor was prepared by mixing 1.1 moles of maleic anhydride and 1.0 mole of ethylene glycol and heating the resulting mixture at 193° C. The polyester thus prepared had an acid number of 153.

A solution of methyl methacrylate polymer in the monomer was prepared by dissolving 54 grams of methyl methacrylate polymer sold under the trade name of Lucite 40 in 96 grams of methylmethacrylate containing 0.006% hydroquinone as an inhibitor. Solution of the polymer in the monomer was effected by warming the mixture with stirring at 150° F. When the polymer had dissolved in the monomer, 100 grams of 200-mesh and finer calcium sulfate and one gram of benzoyl peroxide were added to and mixed with the solution. Thereafter one gram of the polyester promotor was incorporated in the mixture.

A rolled copper foil 0.0014 inch thick and measuring 12" x 12" was cleaned with chromic acid solution. The methyl methacrylate composition was spread in an even layer on the copper sheet, and the composite was then placed into a mold and heated for ten minutes under a pressure of 200 p.s.i. and at a temperature of 210° F. At the end of this period, the methyl methacrylate composition had been converted to a hard, rigid, plastic sheet strongly adherent to the copper foil.

The copper-clad plastic panel was tested for adherence by a standard peel test wherein a strip of the copper foil 1 inch wide is pulled at a 90° angle from the plastic base, and the force required to separate the copper foil from the base is measured. In the case of the present panel a force of 10½ to 12 pounds was required to separate the copper from the plastic.

*Example 2*

A solution of 65 grams of methyl methacrylate polymer was dissolved in 115 grams of monomer in accordance with the procedure of Example 1. Thereafter, one gram of the polyester adhesion promoter of Example 1 and one gram of benzoyl peroxide were dissolved in the methacrylate polymer solution.

A 12" x 12" copper sheet prepared as in the Example 1 was laid down and on top of this was placed a 12" x 12" sheet of woven glass cloth sold under the trade name Style 181, Garan Finish Glass Cloth. This cloth has 57 threads per inch in the warp and 54 threads per inch in the fill direction. The methacrylate polymer solution was spread in an even layer over this glass cloth sheet. A second sheet of the same glass cloth was placed on top of the solution on the first layer of glass cloth. The composite of copper foil and resin filled glass cloth was then placed in a mold and heated at 210° F. for 10 minutes under a pressure of 200 p.s.i.

A rigid, glass-cloth-reinforced panel resulted to which the copper sheet was strongly adherent. Peel strength measurements on this panel showed that a force of 10 to 11 pounds was required to separate the copper from the base laminate.

*Example 3*

To 180 grams of a solution of methacrylate polymer in the monomer as prepared in Example 2 was added 3.6 grams of a polyethylene glycol-dimethacrylate ester sold under the trade name of "Monomer MG–1." 1 gram of benzoyl peroxide and one gram of the polyester adhesion promoter of Example 1 were added to this mixture.

This solution was used in accordance with the procedure of Example 2 to prepare a rigid, glass-cloth-reinforced panel having a copper sheet strongly adherent thereto. Peel strength measurements on this panel showed that a force of 9½ to 10¼ pounds was required to separate the copper from the base laminate.

*Example 4*

To a solution of 32 grams of methyl methacrylate polymer in 58 grams of monomer there were added 56 grams of a 68% chlorinated diphenyl sold under the trade name Aroclor, 20 grams of antimony trioxide, 33 grams calmium sulfate and 11 grams of Satintone No. 1. To the resulting mixture there was added 2 grams of Monomer MG–1 (identified further in Example 3), 0.5 gram benzoyl peroxide and 1 gram of a maleic anhydride-ethylene glycol polyester like that of Example 1 but having an acid number of 114.

The resulting mixture was applied to glass cloth on a copper sheet as described in Example 2 and molded to prepare a rigid, reinforced panel. Peel strength measurements on this panel showed that a force of 7 to 7½ pounds per inch of width of copper foil was required to separate the copper from the base laminate.

*Example 5*

The procedure of Example 4 was followed except that a different adhesion promoter was used. In this example the adhesion promoter was prepared by reacting 0.5 mole of maleic anhydride and 0.5 mole of succinic anhydride with 1.1 moles of ethylene glycol to obtain a polyester having an acid number of 64. The amount of this polyester used was the same as in Example 4, namely 1 gram.

The resulting bonding composition was used to prepare a glass-reinforced, copper-clad laminate as described in Example 2. In the peel strength test, a force of 7 to 7½ pounds per inch of width was required to separate the copper from the panel.

*Example 6*

The procedure of Example 5 was followed except that a different adhesion promoter was used. In this example the polyester promoter was prepared by reacting 1 mole of itaconic anhydride with 1.1 moles of ethylene glycol. The quantity of promoter used was the same as in Example 5. The resulting bonding composition was used to prepare a glass-reinforced, copper-clad laminate as described in Example 2.

The peel strength of the panel as thus prepared was 9 to 9½ pounds per inch of width of the copper.

*Example 7*

A solution of 65 grams of methyl methacrylate polymer and 115 grams of methyl methacrylate monomer containing 0.006% hydroquinone inhibitor was prepared in the same way as in Example 1. 1.5 grams of benzoyl peroxide and 1 gram of an alpha,beta-unsaturated polymeric ester resin prepared by reacting 1 mole maleic acid with 1.1 moles of propylene glycol to an acid number of 78 were then dissolved in the methacrylate polymer solution. This composition was then added to glass cloth and copper foil and subjected to heat and pressure as described in Example 2. A rigid, glass-cloth-reinforced panel resulted to which the copper sheet was strongly adherent. Peel strength measurements on this panel showed a force of 4½ to 5½ pounds was required to separate the copper from the base laminate.

*Example 8*

The procedure of Example 7 was followed exactly save that 1 gram of an alpha-beta-unsaturated polymeric ester resin prepared by reacting 1 mole of fumaric acid with 1.1 moles of 1,1 isopropylidene bis(p-phenyleneoxy)di-2-propanol was used instead of the maleic anhydride propylene glycol unsaturated polymeric ester resin in the preparation of the methyl methacrylate bonding composition. A rigid, glass-cloth-reinforced panel resulted to which the copper sheet was strongly adherent. Peel strength measurements on this panel showed a force of 9 to 10 pounds was required to separate the copper from the base laminate.

*Example 9*

To a solution of 43.3 grams of methyl methacrylate polymer in 76.7 grams of methyl methacrylate monomer was added 100 grams of calcium sulfate, 1 gram benzoyl peroxide and 30 grams of an alpha-beta-unsaturated polymeric ester resin prepared by reacting 1 mole of maleic anhydride and 1.1 moles of ethylene glycol to an acid number of 114. This corresponds to an addition of 25% by weight of the unsaturated polyester resin based on the weight of methyl methacrylate present. This composition was added to glass cloth and copper foil and subjected to heat and pressure as described in Example 2. A glass-cloth-reinforced panel resulted to which the copper sheet was strongly adherent. Peel strength measurements on this panel showed a force of 5½ to 6 pounds was required to separate the copper from the base laminate.

*Example 10*

To a solution of 38 grams of methyl methacrylate polymer in 67 grams of methyl methacrylate monomer was added 100 grams of calcium sulfate, 1 gram benzoyl peroxide and 45 grams of an alpha,beta-unsaturated polymeric ester resin prepared by reacting 1 mole of maleic anhydride and 1.1 moles of ethylene glycol to an acid number of 114. This corresponds to an addition of approximately 45% by weight of the unsaturated polyester resin based on the weight of methacrylate present. This composition was added to glass cloth and copper foil and subjected to heat and pressure as described in Example 2. A glass-cloth-reinforced panel resulted to which the copper sheet was adherent. Peel strength measurements on this panel showed a force of 3½ to 4½ pounds was required to separate the copper from the base laminate.

*Example 11*

To 180 grams of a solution of 65 grams of methyl methacrylate polymer in 70 grams of methyl methacrylate monomer and 45 grams of acrylonitrile monomer was added 1.5 grams of benzoyl peroxide and 1 gram of an alpha,beta-unsaturated polymeric ester resin prepared by reacting 1.1 moles of maleic anhydride with 1 mole of ethylene glycol to an acid number of 153. This solution was added to glass cloth and copper foil and the composite treated as described in Example 2. A rigid, glass-cloth-reinforced panel resulted to which the copper sheet was strongly adherent. Peel strength measurements on this panel showed a force of 6½ to 7 pounds was required to separate the copper from the base laminate.

*Example 12*

To 180 grams of a solution of 65 grams of methyl methacrylate polymer in 70 grams of methyl methacrylate monomer and 45 grams of methyl acrylate monomer was added 1.5 grams of benzoyl peroxide and 1 gram of an alpha,beta-unsaturated polymeric ester resin prepared by reacting 1.1 moles of maleic anhydride with 1 mole of ethylene glycol to an acid number of 153. This solution was added to glass cloth and copper foil and the composite subjected to heat and pressure as described in Example 2. A rigid, glass-cloth-reinforced panel resulted to which the copper sheet was strongly adherent. Peel strength measurements on this panel showed a force of 9 to 10 pounds was required to separate the copper from the base laminate.

*Example 13*

To 180 grams of a solution of 65 grams of methyl methacrylate polymer in 115 grams of methyl methacrylate monomer was added 1.5 grams of benzoyl peroxide and 1 gram of an alpha,beta-unsaturated polymeric ester resin prepared by reacting 1 mole of maleic anhydride and 1.1 moles of 1,5-pentanediol to an acid number of 29. This solution was applied as described in Example 2 to a reinforcing structure on a copper sheet, but a different reinforcing material was used, namely, two layers of a 25 gram/sq. ft. weight, non-woven mat sold under the trade name of "Dacron" fiber mat. The composite was subjected to heat and pressure as described in Example 2. An organic-fiber-reinforced panel resulted to which the copper sheet was adherent. Peel strength measurements on this panel showed a force of 4 to 5 pounds was required to separate the copper from the base laminate.

*Example 14*

This example illustrates the use of the present compositions as an adhesive to bond copper to various other materials. A methacrylate bonding composition was prepared by dissolving methyl methacrylate polymer in methyl methacrylate monomer to give a 36% by weight concentration of methyl methacrylate polymer in the solution. To 180 grams of this solution was added 1.5 grams of benzoyl peroxide and 1 gram of an alpha, beta-unsaturated polymeric ester resin prepared by reacting 1.1 moles of maleic anhydride with 1 mole of ethylene glycol to an acid number of 153. This solution was coated in a thin film on copper foil, and separate pieces of the coated copper were joined to each of the four base materials listed below by placing the coated surface of the copper in contact therewith and subjecting the composite to 210° F. at a pressure of 200 p.s.i. for 10 minutes. At the end of the heating period the copper foil-coated base materials were cooled to room temperature and peel strength measurements made with the following results:

| Base materials to which coated copper foil was joined: | Peel strength in pounds per inch of copper width |
|---|---|
| Paper base phenolic laminate ("Formica" Grade XXXP-36) | 7–9 |
| Non-woven, glass-mat-reinforced, styrene-unsaturated alkyd polyester resin | 5–7 |
| Glass-cloth-reinforced, epoxy resin panel ("Formica" Grade FF-91) | 9–10 |
| Glass-cloth-reinforced, diallylphthalate resin panel | 8–10 |

*Example 15*

To 180 grams of a solution of 65 grams of methyl methacrylate polymer in 115 grams of methyl methacrylate monomer was added 1.5 grams of benzoyl peroxide and 1 cc. of a methacrylate monomer solution containing 0.01 gram of the alpha, beta-unsaturated polymeric ester resin described in Example 1. This corresponds to an addition of 0.0056% by weight of the unsaturated polyester resin based on the weight of methyl methacrylate present. This composition was added to glass cloth and copper foil and subjected to heat and pressure as described in Example 2. A glass-cloth-reinforced panel resulted to which the copper sheet was strongly adherent. Peel strength measurements on this panel showed a force of 9½ to 10½ pounds was required to separate the copper from the base laminate.

*Example 16*

To 180 grams of a solution of 65 grams of methyl methacrylate polymer in 115 grams of methyl methacrylate monomer was added 1.5 grams of benzoyl peroxide and 1.0 gram of an alpha, beta-unsaturated polyester prepared by reacting 1.1 moles of ethylene glycol with 0.5 mole of ortho-phthalic anhydride and 0.33 mole of aconitic acid [$HOOC—CH{=}C(COOH)—CH_2—COOH$] at 210° C. to an acid number of 83. This solution was added to glass cloth and copper foil as described in Example 2 and the composite subjected to heat and pressure. A rigid glass cloth reinforced panel resulted to which the copper sheet was strongly adherent. Peel strength measurements on this panel showed a force of 5½–6¼ pounds was required to separate a one inch strip of copper from the base laminate.

*Example 17*

To 180 grams of a solution of 65 grams of methyl methacrylate polymer in 115 grams of methyl methacrylate monomer was added 1.5 grams of benzoyl peroxide and 1.1 grams of an alpha, beta-unsaturated polyester prepared by reacting 0.66 mole of glycerol with 1 mole of maleic anhydride at 170° C. to an acid number of 360. This solution was added to glass cloth and copper foil as described in Example 2 and subjected to heat and pressure. A rigid glass cloth reinforced panel resulted to which the copper sheet was strongly adherent. Peel strength measurements on this panel showed a force of 6–8½ pounds was required to separate a one inch strip of copper from the base laminate.

It is of course to be understood that the foregoing examples are illustrative only and that numerous changes can be made in the ingredients, proportions and conditions set forth therein without departing from the spirit of the invention as set forth in the appended claims.

We claim:

1. A copper-clad plastic panel comprising a copper sheet having molded thereto a plastic base with a reticulate reinforcing structure therein, the plastic of said base consisting essentially of a major amount of polymethylmethacrylate and a minor amount of an adhesion promoter to improve the adhesion of said copper sheet to said base, said promoter being a glycol-dicarboxylic acid condensation product, at least 25% by weight of the acid component of said promoter being an acid having an olefinic bond in a position alpha to at least one of the two carboxyl groups thereof.

2. A panel according to claim 1 and wherein said reinforcing structure is composed of glass fibers.

3. A panel according to claim 1 and wherein said reinforcing structure is glass cloth.

4. A copper-clad plastic panel comprising a copper sheet having molded thereto a plastic base, the plastic of said base consisting essentially of a major amount of polymethylmethacrylate and a minor amount of an adhesion promoter to improve the adhesion of said copper sheet to said base, said promoter being a polyhydric alcohol-polybasic acid condensation product wherein at least 25% by weight of the acid component is an acid having an olefinic bond in a position alpha to at least one of the carboxyl groups thereof.

5. A copper-clad plastic panel comprising a copper sheet having a plastic base molded thereto, the plastic of said base consisting essentially of polymethylmethacrylate and from 0.25 to 10 parts by weight of an adhesion promoter per 100 parts of polymethylmethacrylate to improve the adhesion of said copper sheet to said base, said promoter being a condensation product of a glycol and a dicarboxylic acid having an olefinic bond in a position alpha to at least one of the two carboxyl groups thereof.

6. A panel according to claim 5 and wherein said adhesion promoter is a condensation product of maleic acid and ethylene glycol.

7. A panel according to claim 5 and wherein said adhesion promoter is a condensation product of itaconic acid and ethylene glycol.

8. A panel according to claim 5 wherein said adhesion promoter is a condensation product of maleic acid and propylene glycol.

9. A panel according to claim 5 and wherein said adhesion promoter is a condensation product of maleic acid and 1,5 pentane diol.

10. The method of making a copper-clad plastic panel consisting essentially of incorporating in a partially polymerized liquid methylmethacrylate resin a minor amount of an adhesion promoter which is a polyhydric alcohol-polybasic acid condensation product wherein at least 25% by weight of the acid component is an acid having an olefinic bond in a position alpha to at least one of the carboxyl groups thereof to form a liquid viscous mixture, spreading a layer of said mixture on a sheet of copper, and co-molding said copper sheet and liquid mixture at an elevated temperature and pressure to form a laminated panel comprising a resin base to which said copper sheet is strongly adherent.

11. The method of making a copper-clad plastic panel consisting essentially of incorporating in a partially polymerized liquid methylmethacrylate resin from 0.25 to 10 parts of an adhesion promoter per 100 parts of said methacrylate resin, said adhesion promoter being a condensation product of a glycol and a dicarboxylic acid having an olefinic bond in a position alpha to at least one of the two carboxyl groups thereof to form a liquid viscous mixture, placing a sheet of a porous reinforcing structure against a sheet of copper, spreading said viscous mixture over the surface of said reinforcing structure to cause said mixture to flow therethrough into contact with said copper sheet, and co-molding and resulting structure at an elevated temperature and pressure to form a laminated panel comprising a reinforced resin base to which said copper sheet is strongly adherent.

12. A method according to claim 11 and wherein the liquid viscous mixture is spread on the copper sheet before the porous reinforcing structure is applied thereto.

13. A copper-clad plastic panel comprising a copper sheet having molded thereto a plastic base, the plastic of said base consisting essentially of a polymethylmethacrylate and from 0.003 to 45 parts of an adhesion promoter per 100 parts of said polymethylmethacrylate, said adhesion promoter being a polyhydric alcohol-polybasic acid condensation product wherein at least 25% by weight of the acid component is an acid having an olefinic bond in a position alpha to at least one of the carboxyl groups thereof, said base also containing minor proportions of chlorinated hydrocarbon and antimony trioxide to improve the fire resisting properties thereof.

14. A panel according to claim 4 in which the plastic base has been reinforced with at least one layer of a fibrous reinforcing material.

References Cited in the file of this patent

UNITED STATES PATENTS

| | | |
|---|---|---|
| 2,069,983 | Ubben | Feb. 9, 1937 |
| 2,322,310 | Muskat et al. | June 22, 1943 |
| 2,407,479 | D'Alelio | Sept. 10, 1946 |
| 2,443,741 | Kropa | June 22, 1948 |
| 2,534,617 | Mohrman | Dec. 19, 1950 |
| 2,576,073 | Kropa et al. | Nov. 20, 1951 |
| 2,594,096 | Trigg | Apr. 22, 1952 |
| 2,669,521 | Bierly | Feb. 16, 1954 |
| 2,680,699 | Rubin | June 8, 1954 |
| 2,683,839 | Beck | July 13, 1954 |
| 2,894,932 | Bader et al. | July 14, 1959 |
| 2,904,526 | Uelzmann | Sept. 15, 1959 |